(12) United States Patent
Park et al.

(10) Patent No.: US 7,875,416 B2
(45) Date of Patent: Jan. 25, 2011

(54) COMPOSITION FOR FORMING PHOTOSENSITIVE POLYMER COMPLEX AND METHOD OF PREPARING PHOTOSENSITIVE POLYMER COMPLEX CONTAINING SILVER NANOPARTICLES USING THE COMPOSITION

(75) Inventors: Jong Jin Park, Yongin-si (KR); Byung Ha Park, Yongin-si (KR); Young Ung Ha, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/806,902

(22) Filed: Jun. 5, 2007

(65) Prior Publication Data

US 2008/0166670 A1 Jul. 10, 2008

(30) Foreign Application Priority Data

Jan. 5, 2007 (KR) .................. 10-2007-0001349

(51) Int. Cl.
G03F 7/06 (2006.01)
G03F 7/028 (2006.01)
G03F 7/20 (2006.01)

(52) U.S. Cl. .............. 430/270.1; 430/327; 430/330; 430/331; 430/913

(58) Field of Classification Search ........... 430/270.1, 430/280.1, 567, 617, 264, 322
See application file for complete search history.

(56) References Cited

U.S. PATENT DOCUMENTS

| | | | |
|---|---|---|---|
| 6,391,523 B1 * | 5/2002 | Hurditch et al. | 430/280.1 |
| 6,534,235 B1 * | 3/2003 | Hanabata et al. | 430/191 |
| 6,630,287 B2 * | 10/2003 | Towata | 430/311 |
| 6,818,304 B2 * | 11/2004 | Miyako et al. | 428/412 |
| 2002/0126377 A1 * | 9/2002 | Nakagawa et al. | 359/443 |
| 2004/0224252 A1 * | 11/2004 | Kondo et al. | 430/270.1 |
| 2005/0260522 A1 * | 11/2005 | Weber et al. | 430/270.1 |
| 2007/0229953 A1 * | 10/2007 | Chen et al. | 359/485 |
| 2008/0020317 A1 * | 1/2008 | Park et al. | 430/138 |

FOREIGN PATENT DOCUMENTS

| | | |
|---|---|---|
| EP | 0653763 | 5/1995 |
| JP | 2003-280184 | 10/2003 |
| JP | 2004-163580 | 6/2004 |
| KR | 10-2003-0031089 | 4/2003 |
| KR | 10-2006-0027746 | 3/2006 |
| WO | WO 99/67794 | 12/1999 |

OTHER PUBLICATIONS

Wenhui Zhou et al., "An Efficient Two-Photon-Generated Photoacid Applied to Positive—Tone 3D Micofabrication", Science 296, 1106-1109 (2002).
Tianyue Yu et al., "Chemical Amplified Positive Resists for Two-Photon Three Dimensional Microfabrication", Adv. Mater. 2003, 15, No. 6, Mar. 17.
Jong-Jin Park et al., "Formation of Silver Nanoparticles in Photosensitive Components: Control of Size and Microfabrication", Nano Korea 2007; p. 410, Aug. 29-31, 2007.
European Search Report dated Dec. 29, 2008, in corresponding European Application No. 07150275.1.

* cited by examiner

*Primary Examiner*—Cynthia H Kelly
*Assistant Examiner*—Anca Eoff
(74) *Attorney, Agent, or Firm*—Harness, Dickey & Pierce, P.L.C.

(57) ABSTRACT

A liquid-type composition for forming a photosensitive polymer complex and a method of preparing a photosensitive polymer complex containing silver nanoparticles using the same are provided. The composition for forming a photosensitive polymer complex includes a multifunctional epoxy resin, a photoacid generator, an organic solvent and a silver compound, or additionally includes a multifunctional acrylate resin and a photoinitiator, or an additive, e.g., a surfactant or a flow improver. This composition is applied, selectively exposed, and developed, thus preparing a photosensitive polymer complex, which contains silver nanoparticles uniformly dispersed and formed in the polymer pattern portion thereof through photo reduction and is therefore improved in terms of physical or chemical properties, e.g., heat resistance and wear resistance.

18 Claims, 2 Drawing Sheets

COMPOSITION FOR FORMING PHOTOSENSITIVE POLYMER COMPLEX AND METHOD OF PREPARING PHOTOSENSITIVE POLYMER COMPLEX CONTAINING SILVER NANOPARTICLES USING THE COMPOSITION

PRIORITY STATEMENT

This non-provisional application claims priority under U.S.C. §119(a) to Korean Patent Application No. 10-2007-0001349, filed on Jan. 11, 2007, in the Korean Intellectual Property Office (KIPO), the entire contents of which are incorporated herein by reference.

BACKGROUND

1. Field

Example embodiments relate to a composition for forming a photosensitive polymer complex and applications thereof, the photosensitive polymer complex, an electronic device comprising the photosensitive polymer complex and a method of preparing a photosensitive polymer complex containing silver nanoparticles using the composition and a method of fabricating an electronic device comprising the photosensitive polymer complex. Other example embodiments relate to a composition for forming a photosensitive polymer complex, which is used in a liquid form essentially comprising a multifunctional epoxy resin, a photoacid generator, an organic solvent, and a silver compound, or additionally comprising a multifunctional acrylate resin and a photoinitiator, or an additive, e.g., a surfactant, to increase the dispersibility and formability of silver nanoparticles in a resultant polymer pattern through photoreduction, in order to improve physical or chemical properties, e.g., heat resistance and wear resistance, and a method of preparing a photosensitive polymer complex containing silver nanoparticles using the composition.

2. Description of the Related Art

An inkjet printer, which is an apparatus for printing an image by ejecting minute droplets of ink at desired positions on a printing medium, is inexpensive and is able to print many kinds of colors at a relatively high resolution, and therefore is widely used.

This inkjet printer may include an inkjet head and an ink reservoir connected to the inkjet head. The inkjet head may include a chamber plate defining an ink flow path and an ink chamber, a heating resistor located in the ink chamber and a nozzle layer having a nozzle located to correspond to the heating resistor. The ink, which is stored in the ink reservoir, passes through an ink supply inlet, flows along the ink flow path, and is then supplied into the ink chamber. When current is applied to the heating resistor, the heating resistor generates heat, and the heat thus generated is used to produce bubbles in the ink supplied into the ink chamber. The bubbles expand to thus apply pressure to the ink in the ink chamber. Consequently, the ink may be ejected through the nozzle by the pressure.

To reliably and stably operate the inkjet printer, various requirements need to be met. There needs to be heat resistance of the ink flow path, for example, heat conductivity. Because heat generated in the inkjet printer plays an important part in determining the quality of an image, the amount of frictional heat, generated in the course of supplying the ink into the ink chamber along the ink flow path, which is effectively removed, has a great influence on the performance of the inkjet printer.

In this regard, the related art discloses a process of synthesizing UV curable urethane acrylate or epoxy acrylate containing silver nanoparticles using a monomer in which a silver salt is dissolved. Further, the related art discloses a method of manufacturing the head of an inkjet printer using a photocurable resin composition containing a photobase generator. However, the development of new techniques for solving the above problems is still required.

SUMMARY

Example embodiments have been made keeping in mind the above problems encountered in the related art. Example embodiments provide a composition for forming a photosensitive polymer complex, which is a liquid type obtained by adding a photocurable epoxy resin composition with a silver compound having high heat conductivity and mechanical strength and an organic solvent that is relatively highly miscible with the polymer resin, to improve heat resistance, wear resistance, and dispersibility.

Example embodiments also provide the photosensitive polymer complex. Example embodiments provide an electronic device, comprising the photosensitive polymer complex containing silver nanoparticles, prepared using the above method.

Example embodiments also provide a method of preparing a photosensitive polymer complex containing silver nanoparticles, in which the composition for forming a photosensitive polymer complex is applied, selectively exposed, and developed, so that the silver nanoparticles are uniformly dispersed and formed in the polymer pattern portion thereof through photoreduction and a method of fabricating the electronic device comprising the photosensitive polymer complex.

Example embodiments provide a composition for forming a photosensitive polymer complex, comprising a multifunctional epoxy resin, a photoacid generator, an organic solvent, and a silver compound. Further, the composition may include a multifunctional acrylate resin and a photoinitiator. Furthermore, the composition may include at least one additive selected from the group consisting of a surfactant, a flow improver, a viscosity modifier, a filler, a silane coupling agent, a dye, a pigment, and a UV photosensitizer.

Example embodiments provide a method of preparing a photosensitive polymer complex containing silver nanoparticles, comprising applying the composition for forming a photosensitive polymer complex on the surface of a substrate, selectively exposing the applied film to light using a photomask having a desired pattern, and developing the exposed film using a developing solution.

Further, the preparation method may include post-baking the exposed film after selectively exposing the applied film to light, or post-curing the developed film after developing the exposed film.

BRIEF DESCRIPTION OF THE DRAWINGS

Example embodiments will be more clearly understood from the following detailed description taken in conjunction with the accompanying drawings. FIGS. 1-3 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described in greater detail with reference to the accompanying drawings. In the drawings, the thicknesses and widths of layers are exaggerated for clarity. Example embodiments may, however, be embodied in many different forms and should not be construed as limited to the example embodiments set forth herein. Rather, these example embodiments are provided so that this disclosure will be thorough and complete, and will fully convey the scope of example embodiments to those skilled in the art.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

According to example embodiments, the composition for forming a photosensitive polymer complex is provided. The composition may include a multifunctional epoxy resin, a photoacid generator, an organic solvent, and a silver compound. The composition may be a liquid type, in which a photocurable epoxy resin composition including the photoacid generator is added with the silver compound, having high heat conductivity and mechanical strength, and an organic solvent that is highly compatible with the polymer resin. Thus, where the composition is subjected to application, selective exposure and development, a photosensitive polymer complex, which has silver nanoparticles uniformly dispersed and formed in the polymer pattern portion thereof through photoreduction, and therefore is improved in terms of physical or chemical properties, e.g., heat resistance, heat conductivity, wear resistance, and dispersibility, may be prepared.

In example embodiments, the multifunctional epoxy resin may not be particularly limited, but may have two or more functions and may contain an oxirane group, and specific examples thereof may include, but may not be limited to, bisphenol A type epoxy resins, bisphenol F type epoxy resins, hydroquinone type epoxy resins, resorcinol type epoxy resins, and novolac type epoxy resins, which may be used alone or in mixtures of two or more thereof. Commercially available examples of the epoxy resin may include EPON 828, EPON 1004, EPON 1001F, EPON 1010, EPON SU-8, available from Shell Chemicals, DER-331, DER-332, DER-334, DEN-431, DEN-439, available from Dow Chemical Company, and ERL-4201, ERL-4289, ERL-0400, available from Union Carbide Corporation.

The amount of the multifunctional epoxy resin may be determined according to an appropriate choice made by one skilled in the art depending on the end use and need, and may be set in the range of about 30 wt %~about 90 wt %, for example, about 50 wt %~about 75 wt %, based on the total amount of the composition for forming a photosensitive polymer complex. As such, when the amount of the epoxy resin is less than about 30 wt %, a tough film may not be obtained. On the other hand, when the amount exceeds about 90 wt %, improved heat conductivity may not be attained.

As the photoacid generator, any photoacid generator may be used as long as it produces an acid using light, and examples thereof may include, but may not be limited to, onium photoacid generators, ionic photoacid generators including diphenyl iodonium salts of hydroxyl-containing aromatic sulfonic acid, DNQ (diazonaphthoquinone) photoacid generators, nonionic photoacid generators including nitrobenzyl sulfonic acid, and polymer photoacid generators, which may be used alone or in mixtures of two or more thereof.

For example, the onium photoacid generator may have a structure represented by each of Formulas 1 to 11 below, and the ionic photoacid generator including diphenyl iodonium salts of hydroxyl-containing aromatic sulfonic acid may have the structure represented by Formula 12 below. The DNQ (diazonaphthoquinone) photoacid generator may have the structure of Formula 13 below, and the nonionic photoacid generator including nitrobenzyl sulfonic acid may have the structure of Formula 14 below. Also, the polymer photoacid generator may be a polymer having a molecular weight from about 500 to about 1,000,000, in which a sulfonium salt or iodonium salt is contained in the main chain or side chain thereof or an organic photoacid generating group is contained in the side chain thereof, thus generating acid with light:

Formula 1 wherein $R_6$ and $R_7$ are each independently a linear, branched or cyclic $C_{1\sim10}$ alkyl group, and Z is a sulfonyl group or a carbonyl group.

Examples of the compound having the structure of Formula 1 may include 1-cyclohexylsulfonyl-1-(1,1-dimethylethylsulfonyl)diazomethane, bis(1,1-dimethylethyl sulfonyl)diazomethane, bis(1-methylethylsulfonyl)methane, bis(cyclohexylsulfonyl)diazomethane, 1-cyclohexylsulfonyl-1-cyclohexylcarbonyldiazomethane, 1-diazo-1-cyclohexylsulfonyl-3,3'-dimethylbutan-2-one, 1-diazo-1-methylsulfonyl-4-phenyl butan-2-one, 1-diazo-1-(1,1-dimethylethylsulfonyl)-3,3-dimethyl-2-butanone and/or 1-acetyl-1-(1-methylethylsulfonyl)diazomethane.

Formula 2 wherein $R_8$ and $R_9$ are each independently a hydrogen atom, a halogen atom, a linear or branched $C_{1\sim10}$ alkyl group, or a $C_{1\sim12}$ phenylalkyl group.

Examples of the compound having the structure of Formula 2 may include bis(cyclohexylsulfonyl)diazomethane, bis(p-toluenesulfonyl)diazomethane, methylsulfonyl-p-toluenesulfonyldiazomethane, 1-diazo-1-(p-toluenesulfonyl)-3,3-dimethyl-2-butanone, bis(p-chlorobenzenesulfonyl)diazomethane, and/or cyclohexylsulfonyl-p-toluenesulfonyldiazomethane.

Formula 3 wherein $R_{10}$ and $R_{11}$ are each independently a hydrogen atom, a halogen atom, a linear or branched $C_{1\sim10}$ alkyl group, a $C_{1\sim12}$ phenylalkyl group, a phenyl group, or a tolyl group.

Examples of the compound having the structure of Formula 3 may include 1-cyclohexylsulfonyl-1-cyclohexylcarbonyl diazomethane, 1-p-toluenesulfonyl-1-cyclohexylcarbonyl diazomethane, 1-diazo-1-(p-toluenesulfonyl)-3,3-dimethylbutan-2-one, 1-diazo-1-benzenesulfonyl-3,3-dimethylbutan-2-one and/or 1-diazo-1-(p-toluenesulfonyl)-3-methylbutan-2-one.

Formula 4 wherein $R_{12}$ is a $C_{1\sim12}$ phenylalkyl group or a phenyl group.

Examples of the compound having the structure of Formula 4 may include 1,2,3-tris(trifluoromethanesulfonyloxy)benzene, 1,2,3-tris(2,2,2-trifluoroethanesulfonyloxy)benzene, 1,2,3-tris(2-chloroethane sulfonyloxy)benzene, 1,2,3-tris(p-trifluorobenzenesulfonyloxy)benzene, 1,2,3-tris(p-nitrobenzenesulfonyloxy)benzene, 1,2,3-tris(2,3,4,5-pentafluorobenzenesulfonyloxy)benzene, 1,2,3-tris(p-fluorobenzenesulfonyloxy)benzene, 1,2,3-tris(methanesulfonyl oxy)benzene, 1,2,4-tris(p-trifluoromethyloxybenzenesulfonyloxy)benzene, 1,2,4-tris(2,2,2-trifluoroethanesulfonyloxy)benzene, 1,2,4-tris(2-thienylsulfonyloxy)benzene, 1,3,5-tris(methane sulfonyloxy)benzene, 1,3,5-tris(trifluoromethanesulfonyloxy)benzene, 1,3,5-tris(2,2,2-trifluoroethanesulfonyloxy)benzene, 1,3,5-tris(p-nitrobenzenesulfonyloxy)benzene, 1,3,5-tris(2,3,4,5,6-pentafluorobenzenesulfonyloxy)benzene, 1,3,5-tris(p-fluorobenzenesulfonyloxy)benzene and/or 1,3,5-tris(2-chloroethane sulfonyloxy)benzene.

Formula 5 wherein $R_{12}$, $R_{21}$ and $R_{22}$ are each independently a $C_{1\sim12}$ phenylalkyl group or a phenyl group.

Examples of the compound having the structure of Formula 5 may include 2,3,4-tris(p-fluorobenzene sulfonyloxy) benzophenone, 2,3,4-tris(trifluoromethanesulfonyl oxy)benzophenone, 2,3,4-tris(2-chloroethanesulfonyloxy) benzophenone, 2,3,4-tris(p-trifluoromethylbenzenesulfonyloxy)benzophenone, 2,3,4-tris(p-nitrobenzenesulfonyloxy)benzophenone, 2,3,4-tris(p-fluorobenzenesulfonyloxy)acetophenone, 2,3,4-tris(2,3,4,5,6-pentafluorobenzenesulfonyl oxy)acetophenone, 2,3,4-tris(2-nitrobenzenesulfonyloxy)acetophenone, 2,3,4-tris(2,5-dichlorobenzenesulfonyloxy)acetophenone, 2,3,4-tris(2,3,4-trichlorobenzenesulfonyloxy)acetophenone, 2,2',4,4'-tetra(methanesulfonyloxy)benzophenone, 2,2',4,4'-tetra(2,2,2-trifluoroethanesulfonyloxy)benzophenone, 2,2',4,4'-tetra(2-chloroethanesulfonyloxy)benzophenone, 2,2',4,4'-tetra(2,5-dichlorobenzenesulfonyloxy)benzophenone, 2,2',4,4'-tetra (2,4,6-trimethylbenzenesulfonyloxy)benzophenone and/or 2,2',4,4'-tetra(m-trifluoromethylbenzenesulfonyloxy)benzophenone.

Formula 6 wherein $R_{25}$, $R_{26}$ and $R_{27}$ are each independently a $C_{1\sim12}$ phenylalkyl group or a phenyl group, and X is methanesulfonate, trifluoromethanesulfonate, p-toluenesulfonate, 10-camphorsulfonate, cyclohexanesulfamate, perfluoro-1-butanesulfonate, Cl, Br, $SbF_6$, $BF_4$, $PF_6$ or $AsF_6$.

Examples of the compound having the structure of Formula 6 may include triphenylsulfonium trifluoromethanesulfonate, triphenylsulfonium perfluorooctane sulfonate, diphenyl-p-tolylsulfonium perfluorooctanesulfonate, tris(p-tolyl)sulfonium perfluorooctanesulfonate, tris(p-chlorobenzene)sulfonium trifluoromethanesulfonate, tris(p-tolyl)sulfonium trifluoromethanesulfonate, trimethylsulfonium trifluoromethanesulfonate, dimethylphenylsulfonium trifluoro methanesulfonate, dimethyltolylsulfonium trifluoromethane sulfonate, dimethyltolylsulfonium perfluorooctanesulfonate, triphenylsulfonium p-toluenesulfonate, triphenylsulfonium methanesulfonate, triphenylsulfonium butanesulfonate, triphenylsulfonium n-octanesulfonate, triphenylsulfonium 1-naphthalenesulfonate, triphenylsulfonium 2-naphthalenesulfonate, triphenylsulfonium 10-camphorsulfonate, triphenylsulfonium 2,5-dichlorobenzenesulfonate, diphenyltolylsulfonium 1,3,4-trichlorobenzenesulfonate, dimethyltolylsulfonium p-toluenesulfonate, diphenyltolyl sulfonium 2,5-dichlorobenzenesulfonate, triphenylsulfonium chloride, triphenylsulfonium bromide, triphenylsulfonium tetrafluoroborate, triphenylsulfonium pentafluoroantimonate, triphenylsulfonium pentafluorophosphate and/or triphenylsulfonium pentafluoroarsenate.

Formula 7 wherein X is methanesulfonate, trifluoromethanesulfonate, p-toluenesulfonate, 10-camphorsulfonate, cyclohexanesulfamate, perfluoro-1-butanesulfonate, Cl, Br, $SbF_6$, $BF_4$, $PF_6$ or $AsF_6$, and $D_1$ and $D_2$ are each independently a hydrogen atom, a $C_{1\sim6}$ alkyl group, or a vinyloxymethyl group.

Formula 8 wherein R is a $C_{1\sim10}$ alkyl group, and $MX_n^-$ is $BF_4^-$, $PF_6^-$, $AsF_6^-$ or $SbF_6^-$.

Formula 9

Formula 10 wherein $MX_n^-$ is $PF_6^-$ or $SbF_6^-$.

Formula 11 wherein R is a $C_{1\sim10}$ alkyl group, and $MX_n^-$ is $PF_6^-$ or $SbF_6^-$.

Formula 12 wherein R, $R_{10}$ and $R_{11}$ are each independently a $C_{1\sim12}$ alkyl or alkoxy group, or a hydroxyl group, and $Ar_1$, $Ar_2$ and $Ar_3$ are each independently a phenyl group, a naphthalene group, or an anthracene group.

Formula 13 wherein $Q_1$ and $Q_2$ are each independently a $C_{1\sim12}$ alkyl or aryl group, and g and h are each independently an integer of 1 or more.

Formula 14 wherein $R_{12}$ is a $C_{1\sim12}$ alkyl or aryl group containing a heteroatom, and j is an integer from 1 to 3.

The amount of the photoacid generator in the composition of example embodiments may be determined according to an appropriate choice made by one skilled in the art depending on the end use and need. Considering the UV stability of the composition, the photoacid generator is used in an amount of about 0.1 wt %~about 10 wt %, for example, about 1 wt %~about 5 wt %, but example embodiments may not be limited thereto.

As the organic solvent, any organic solvent may be used without limitation as long as it is typically known in the art, has improved miscibility and compatibility with the multifunctional epoxy resin, and dissolves the silver compound. Examples thereof may include, but may not be limited to, non-photoreactive solvents, e.g., γ-butyrolactone, cyclopentanone, xylene, $C_{1\sim6}$ acetate, tetrahydrofuran, and mixtures of two or more thereof.

The organic solvent may be used in an amount of about 1 wt %~about 70 wt %, for example, about 20 wt %~about 50 wt %, based on the total amount of the composition of example embodiments, in order to obtain a uniform compound.

As the silver compound, any compound containing silver particles may be used. For example, a silver compound which may be dissolved in various organic solvents and may have improved miscibility with the multifunctional epoxy resin and a multifunctional acrylate resin mentioned below. As such, although the size of the silver particles is not particularly limited, the size of the silver particles may fall in the range of about 1 nm~about 100 nm, for example, about 10 nm~about 30 nm, in the interest of resolution and solubility.

Specific examples of the silver compound include, but are not limited to, silver acetate, silver tetrafluoroborate, silver thiocyanate, silver trifluoromethanesulfonate, silver sulfate, silver phosphate, silver trifluoroacetate, silver oxide(I), silver oxide(II), silver iodide, silver chloride, silver carbonate, silver hexafluorophosphate, silver nitride, silver fluoride, silver bromide, and silver hexafluoroantimonate, which may be used alone or in mixtures of two or more thereof.

The silver compound may be used in an amount of about 0.1 wt %~about 20 wt %, for example, about 1 wt %~about 10 wt %, based on the total amount of the composition of example embodiments. When the amount of the silver compound is less than about 0.1 wt %, the silver compound may have difficulty attaining sufficient heat resistance and wear resistance. On the other hand, when the amount exceeds about 20 wt %, the silver compound may act as an impurity, undesirably decreasing the resolution of electronic devices.

Also, the composition for forming a photosensitive polymer complex of example embodiments may further include a multifunctional acrylate resin and a photoinitiator.

The composition of example embodiments may include a multifunctional epoxy resin, which has two or more functions, and the photoacid generator. Accordingly, during the selective exposure for the formation of the complex, in the exposed portion, the photoacid generator acts to produce an acid using light, after which the produced acid reacts with the epoxy group of the epoxy resin to thus cause ring-opening polymerization such that the epoxy resin is crosslinked, therefore improving the mechanical properties, e.g., tensile strength, elasticity, and density. When such a composition may further include the multifunctional acrylate resin and the photoinitiator, the multifunctional acrylate resin is also crosslinked by the photoinitiator, and thus constitutes an interpenetrating polymer network (IPN) along with the crosslinked epoxy resin. Ultimately, the crosslink density of the exposed portion, chemical resistance to ink, and hardness may be further increased.

The multifunctional acrylate resin has three or more functions and contains acryl, and examples thereof may include, but may not be limited to, ethyleneglycol diacrylate, triethyleneglycol diacrylate, 1,4-butanediol diacrylate, 1,6-hexanediol diacrylate, neopentylglycol diacrylate, pentaerythritol diacrylate, pentaerythritol triacrylate, dipentaerythritol diacrylate, dipentaerythritol triacrylate, dipentaerythritol pentaacrylate, dipentaerythritol hexaacrylate, bisphenol A diacrylate, trimethylolpropane triacrylate, novolac epoxy acrylate, ethyleneglycol dimethacrylate, diethyleneglycol dimethacrylate, triethyleneglycol dimethacrylate, propyleneglycol dimethacrylate, 1,4-butanediol dimethacrylate, and 1,6-hexanediol dimethacrylate, which may be used alone or in mixtures thereof.

Although the amount of the multifunctional acrylate resin is not particularly limited, the multifunctional acrylate resin may be set in the range of about 1 wt %~about 20 wt %, for example, about 1 wt %~about 10 wt %, in the interest of solubility and mechanical strength.

The photoinitiator may include any initiator able to produce a radical using light, for example, at least one selected from among triazine compounds, benzophenone compounds, acetophenone compounds, thioxantone compounds, benzoin compounds, carbazole compounds, diketone compounds, sulfonium borate compounds, diazo compounds, and biimidazole compounds may be used.

Specifically, examples of the triazine compound may include 2,4,6-trichloro-s-triazine, 2-phenyl-4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-biphenyl-4,6-bis(trichloromethyl)-s-triazine, bis(trichloro methyl)-6-styryl-s-triazine, 2-(naphtho-1-yl)-4,6-bis(trichloro methyl)-s-triazine, 2-(4-methoxynaphtho-1-yl)-4,6-bis(trichloro methyl)-s-triazine, 2-4-trichloromethyl(piperonyl)-6-triazine and/or 2-4-trichloromethyl(4'-methoxystyryl)-6-triazine.

Examples of the benzophenone compound may include benzophenone, benzoyl benzoate, methyl benzoyl benzoate, 4-phenyl benzophenone, hydroxyl benzophenone, acrylated benzophenone, 4,4'-bis(dimethylamino)benzophenone and/or 4,4'-bis(diethylamino)benzophenone, and examples of the acetophenone compound may include 2,2'-diethoxyacetophenone, 2,2'-dibutoxyacetophenone, 2-hydroxy-2-methylpropiophenone, p-t-butyltrichloroacetophenone, p-t-butyldichloroacetophenone, benzophenone, 4-chloroacetophenone, 4,4'-dimethylaminobenzophenone, 4,4'-dichlorobenzophenone, 3,3'-dimethyl-2-methoxybenzophenone, 2,2'-dichloro-4-phenoxyacetophenone, 2-methyl-1-(4-(methylthio)phenyl)-2-morpholinopropan-1-one and/or 2-benzyl-2-dimethylamino-1-(4-morpholinophenyl)-butan-1-one.

Examples of the thioxantone compound may include thioxantone, 2-methylthioxantone, isopropyl thioxantone, 2,4-diethyl thioxantone, 2,4-diisopropyl thioxantone and/or 2-chlorothioxantone, and examples of the benzoin compound may include benzoin, benzoin methylether, benzoin ethylether, benzoin isopropyl ether, benzoin isobutyl ether and/or benzyl dimethylketal. A photoinitiator may be used in an amount of about 0.1 wt %~about 20 wt %, for example, about 1 wt %~about 5 wt %, based on the total amount of the composition of example embodiments.

Also, the composition of example embodiments may further include an additive. The additive may be at least one material selected from the group consisting of a surfactant, a flow improver, a viscosity modifier suitable for increasing the dispersibility and adhesion of silver nanoparticles, a silane coupling agent suitable for increasing the attachability to the substrate, along with a dye, a pigment and a UV absorbent suitable for controlling the absorption coefficient. This additive may be used in an amount of about 0.1 wt %~about 10 wt %, for example, about 1 wt %~about 5 wt %.

Example embodiments provide a method of preparing a photosensitive polymer complex containing silver nanoparticles through selective exposure and development using the above composition.

In example embodiments, the preparation method may include applying the composition for forming a photosensitive polymer complex on the surface of a substrate, selectively exposing the applied film to light using a photomask having a desired pattern, and developing the exposed film using a developing solution. Below, the preparation method is described in detail.

The composition for forming a photosensitive polymer complex of example embodiments may be prepared, and may then be applied on the surface of the substrate. In order to further increase the dispersibility of the composition before the application thereof, a typical ultrasonication process may be performed, or alternatively, in order to remove the solvent from the composition after the composition is applied, a pre-baking process may be performed at a relatively low temperature, for example, about 80° C.~about 120° C., for a time period from about 30 sec to about 5 min, depending on need. Both the ultrasonication before the application and the pre-baking after the application may be performed.

The substrate may not be particularly limited as long as it does not inhibit the purpose of example embodiments, and glass, a silicon wafer, or plastic may be used as appropriate depending on the end use thereof. A glass substrate may be used in some cases that is surface-treated with $CF_4$ plasma, hydrophobic fluorine or siloxane water-repellent material.

When applying the composition, a typical coating process may be used, and specific examples thereof may include, but may not be limited to, spin coating, dip coating, roll coating, spray coating, gravure coating, imprinting, and inkjet printing. The coating process may be spin coating from the point of view of convenience and uniformity. The spin rate may be set in the range of about 200 rpm~about 3500 rpm. The exact spin rate may be determined depending on the viscosity of the composition and the thickness of the resultant complex. The applied film may be selectively exposed to light using a photomask having a desired pattern.

In the exposure process, light may be UV or DUV (deep UV) ray having a wavelength of about 400 nm or less, and a light source for emitting such light may be a mercury lamp (365 nm), a KrF laser (248 nm), or an ArF laser (193 nm). The exposure amount may be appropriately determined in consideration of the thickness of the complex by those skilled in the art, and may be set in the range of about 50~800 mJ/cm$^2$.

The exposed film may include an unexposed portion, corresponding to the pattern, and an exposed portion, other than the pattern. The exposed portion may be formed in a manner such that an acid, produced from a photoacid generator using light, reacts with the epoxy group of epoxy resin to cause ring-opening polymerization in order to crosslink and cure the epoxy resin, and such that the silver compound is reduced to silver nanoparticles through electron migration by a radical generated from the photoinitiator or another material, at the same time. As such, the crosslinking of the epoxy resin (or acrylate resin) and the organic solvent may act to prevent or retard the silver nanoparticles from aggregating. On the other hand, in the unexposed portion, the epoxy resin (and acrylate resin) may not be crosslinked, but may remain as a monomer or an oligomer. The unexposed portion may be dissolved in the developing solution in a subsequent development process to be removed.

In addition, in order to remove any organic solvent that may remain, a post-baking process may be conducted after the exposure, if required. Such a post-baking process may be performed at about 70° C.~about 300° C., for example, about 100° C.~about 200° C., for a period of time ranging from about 30 sec to about 5 min.

The exposed film may be developed using the developing solution to remove the unexposed portion therefrom, thereby obtaining a photosensitive polymer complex containing silver nanoparticles and having a desired negative pattern.

The developing solution may not be particularly limited, and any organic developing solution which is typically used in the field of photolithography may be used. For example, DMF, 4-hydroxy-4-methyl-2-pentanone, ethylglycol monoethylether or 2-methoxyethanol may be used in terms of film stability and uniformity of the pattern. In addition, a post-curing process may be conducted to further cure the exposed portion and to remove any developing solution that may remain, if required. The post-curing process may be carried out at about 150° C.~about 400° C., the conditions thereof not being limited thereto.

The photosensitive polymer complex, obtained using the above preparation method, may include silver nanoparticles uniformly dispersed and formed in the polymer resin, thus exhibiting improved heat resistance, heat conductivity, and wear resistance, and, in addition, may be formed using the photocurable composition comprising the epoxy resin, and selectively the acrylate resin, the photoacid generator and/or the photoinitiator, therefore realizing an increased crosslink density, resulting in improved mechanical strength, resistance to corrosion by ink, and adhesion to the substrate.

The photosensitive polymer complex containing the silver nanoparticles, according to example embodiments, may be used in various electronic devices, for example, inkjet printers, RFID circuitry, PCB circuits, and electronic circuits, or the ink flow path of the head of the inkjet printer.

A better understanding of example embodiments may be obtained in light of the following examples, which are set forth to illustrate, but are not to be construed as limiting example embodiments.

EXAMPLE 1

A composition for forming a photosensitive polymer complex, comprising about 30 g of a multifunctional epoxy resin (SU-8, available from Shell Chemicals), about 1 g of an onium photoacid generator represented by Formula 15 below, about 50 g of cyclopentanone as an organic solvent, about 8 g of silver oxide (available from Aldrich), and about 1 g of an antifoaming agent (KS-66, available from Shin-Etsu Chemical) as an additive, was prepared. The liquid-type composition thus prepared was ultrasonicated for about 1 hour to sufficiently mix the components thereof, filtered through an about 0.5 μm syringe filter, subjected to spin coating at about 2000 rpm on glass surface-treated with $CF_4$ plasma, and then baked at about 100° C. for about 1 min to remove the organic solvent from the applied film. The film thus formed was exposed to UV light in an exposure amount of about 100 $mJ/cm^2$ for about 120 sec using a photomask having a desired flow path pattern, post-baked at about 100° C. for about 1 min, and was then dipped in 2-methoxyethanol for about 20 sec and thus developed. Thereafter, the resultant film was burned at about 200° C. for about 1 min, thereby obtaining a photosensitive polymer complex containing silver nanoparticles and having a negative pattern.

Formula 15

EXAMPLE 2

A photosensitive polymer complex was prepared in the same manner as in Example 1, with the exception that a composition for forming a photosensitive polymer complex, comprising about 20 g of a multifunctional epoxy resin (SU-8, available from Shell Chemicals), about 0.5 g of an onium photoacid generator represented by Formula 15, about 10.0 g of γ-butyrolactone as an organic solvent, and about 0.5 g of silver carbonate (available from Aldrich), was used.

EXAMPLE 3

A photosensitive polymer complex was prepared in the same manner as in Example 1, with the exception that a composition for forming a photosensitive polymer complex, comprising about 10 g of a multifunctional epoxy resin (SU-8, available from Shell Chemicals), about 10 g of a multifunctional acrylate resin (dipentaerythritol hexaacrylate), about 0.25 g of an onium photoacid generator represented by Formula 15, about 0.25 g of a photoinitiator (Irgacure 651, available from Shinyoung Rad. Chem.), about 10.0 g of γ-butyrolactone as an organic solvent, and about 0.5 g of silver carbonate (available from Aldrich), was used.

COMPARATIVE EXAMPLE 1

A photosensitive polymer complex was prepared in the same manner as in Example 1, with the exception that a composition having no silver oxide was used.

COMPARATIVE EXAMPLE 2

A photosensitive polymer complex was prepared in the same manner as in Example 2, with the exception that a composition having no silver carbonate was used.

COMPARATIVE EXAMPLE 3

A photosensitive polymer complex was prepared in the same manner as in Example 3, with the exception that a composition having no silver carbonate was used.

Evaluation of Properties of Photosensitive Polymer Complex

Figure 1:
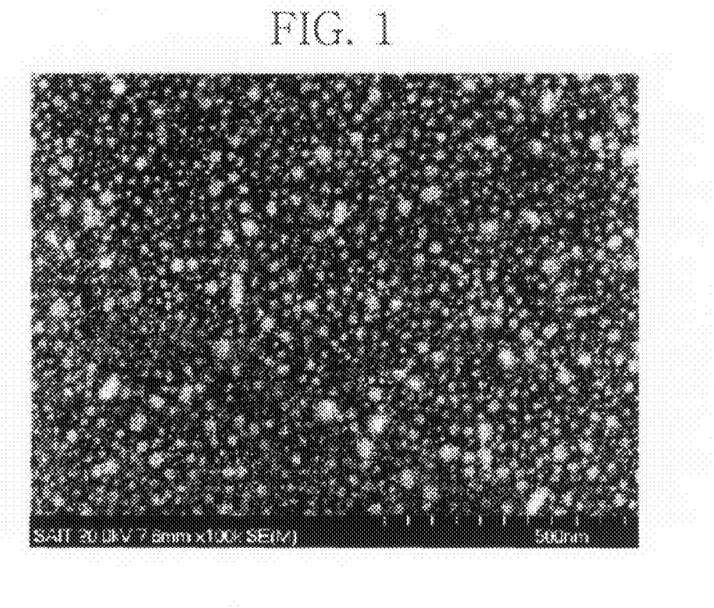
FIG. 1 is a scanning electron micrograph showing the photosensitive polymer complex of Example 1 of example embodiments.

In order to investigate whether the photosensitive polymer complex of Example 1 actually had silver nanoparticles, the polymer complex was observed using a scanning electron microscope. The results are shown in FIG. 1. As seen in FIG. 1, the silver nanoparticles were observed to be agglomerated to a size of about 10 nm~about 30 nm on the surface of the photosensitive polymer complex prepared in Example 1.

Figure 2:
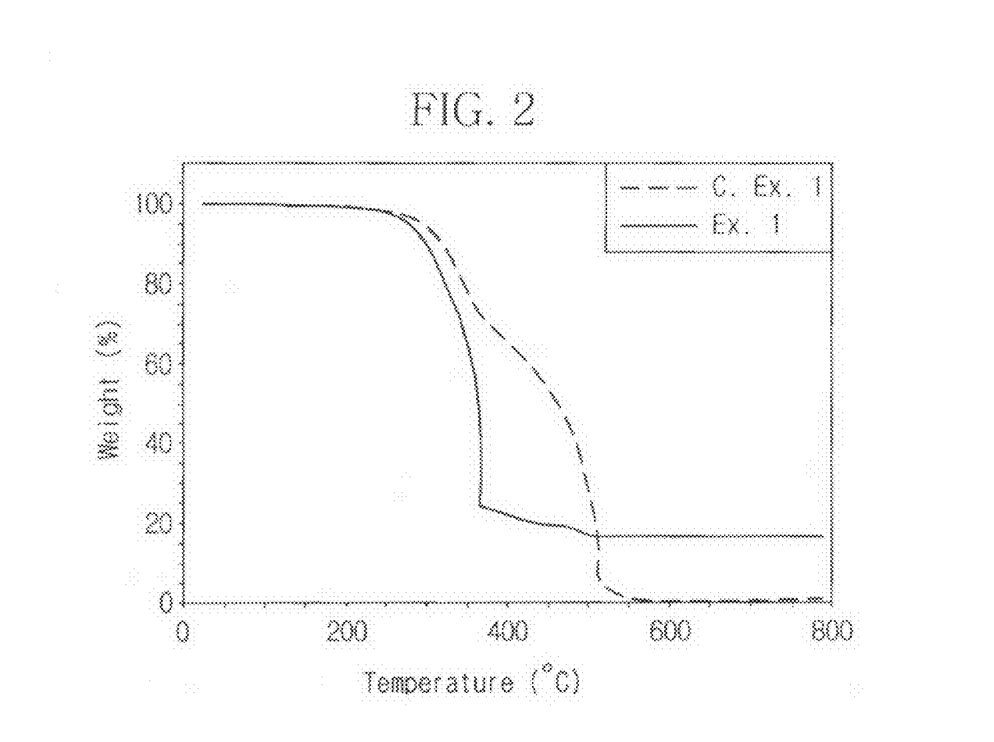
FIGS. 2 and 3 are graphs showing the results of thermal analysis of the photosensitive polymer complexes of Example 1 and Comparative Example 1 of example embodiments, using TGA.
Figure 3:
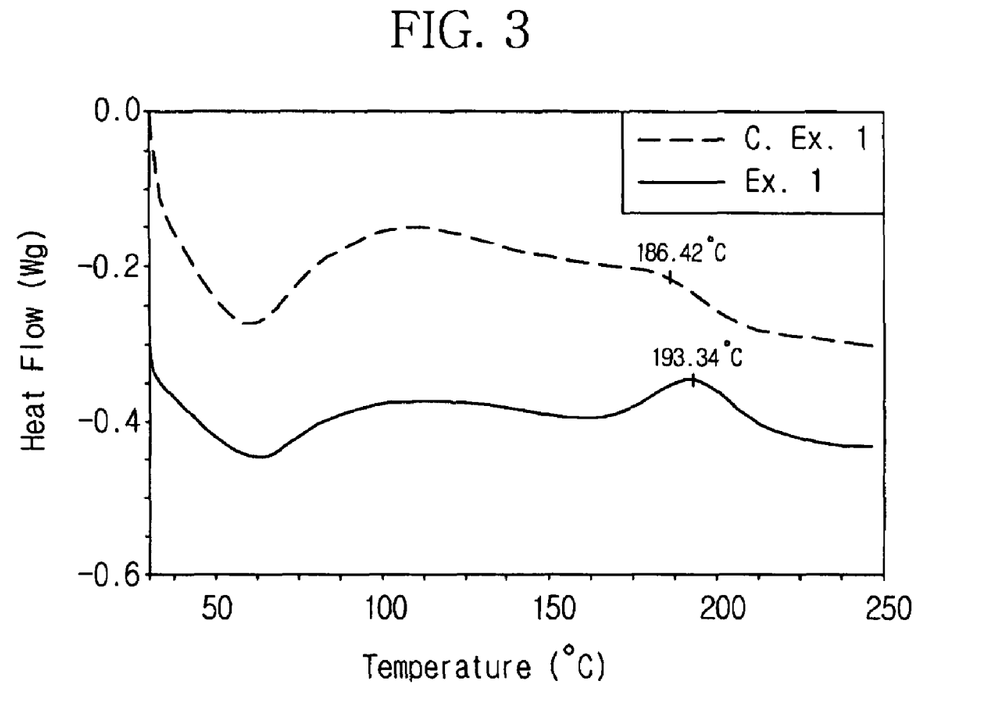

In addition, the photosensitive polymer complexes of Example 1 and Comparative Example 1 were subjected to thermal analysis using TGA. The results are shown in FIGS. 2 and 3. As shown in FIG. 2, when using the complex of Example 1, a weight decrease was reduced at about 400° C. or less due to the decomposition of the silver nanoparticles, and about 18% silver nanoparticles were present, compared to the complex of Comparative Example 1. Further, as shown in FIG. 3, the complex of Comparative Example 1 had a glass transition temperature (Tg) of about 186° C., whereas the complex of Example 1 had a Tg of about 193° C. due to the presence of the silver nanoparticles.

Accordingly, the above results demonstrate the fact that the photosensitive polymer complex of example embodiments, containing the silver nanoparticles uniformly dispersed therein, may exhibit improved heat resistance and heat conductivity, and therefore may be advantageously used as the ink flow path of the head of an inkjet printer.

As described hereinbefore, example embodiments provide a composition for forming a photosensitive polymer complex and a method of preparing a photosensitive polymer complex containing silver nanoparticles using the above composition. According to example embodiments, the composition for forming a photosensitive polymer complex, essentially comprising a multifunctional epoxy resin, a photoacid generator, an organic solvent, and a silver compound, or additionally including a multifunctional acrylate resin and a photoinitiator, or an additive, e.g., a surfactant or a flow improver, is applied, selectively exposed, and developed, thereby forming a photosensitive polymer complex. As such, the photosensitive polymer complex may have silver nanoparticles uniformly dispersed and formed in the polymer pattern portion thereof through photoreduction, thus improving physical or chemical properties, e.g., heat resistance and wear resistance.

Although example embodiments have been disclosed for illustrative purposes, those skilled in the art will appreciate that various modifications, additions and substitutions are possible, without departing from the scope and spirit of the accompanying claims.

What is claimed is:

1. A method of preparing a photosensitive polymer complex containing silver nanoparticles, comprising:
    applying a composition including a multifunctional epoxy resin, a photoacid generator, an organic solvent, and a silver compound on a surface of a substrate to form a film;
    photoreducing the silver compound by selectively exposing the film to light using a photomask having a pattern, and thereby forming silver nanoparticles uniformly dispersed in the photosensitive polymer complex; and
    developing the exposed film using a developing solution, wherein the silver compound is at least one selected from a group consisting of silver acetate, silver tetrafluoroborate, silver thiocyanate, silver trifluoromethanesulfonate, silver sulfate, silver phosphate, silver trifluoroacetate, silver oxide (I), silver oxide (II), silver iodide, silver chloride, silver carbonate, silver hexafluorophosphate, silver fluoride, silver bromide, and silver hexafluoroantimonate.

2. The method as set forth in claim 1, wherein the multifunctional epoxy resin has two or more functions and contains an oxirane group.

3. The method as set forth in claim 2, wherein the multifunctional epoxy resin is at least one selected from a group consisting of bisphenol A type epoxy resin, bisphenol F type epoxy resin, hydroquinone type epoxy resin, resorcinol type epoxy resin, and novolac type epoxy resin.

4. The method as set forth in claim 1, wherein the photoacid generator is at least one selected from a group consisting of an onium photoacid generator, an ionic photoacid generator including diphenyl iodonium salts of hydroxyl-containing aromatic sulfonic acid, a DNQ (diazonaphthoquinone) photoacid generator, a nonionic photoacid generator including nitrobenzyl sulfonic acid, and a polymer photoacid generator.

5. The method as set forth in claim 1, wherein the organic solvent is selected from a group consisting of γ-butyrolactone, cyclopentanone, xylene, $C_{1-6}$ acetate, tetrahydrofuran, and mixtures of two or more thereof.

6. The method as set forth in claim 1, wherein the composition comprises about 30 wt %~about 90 wt % of the multifunctional epoxy resin, about 0.1 wt %~about 10 wt % of the photoacid generator, about 1%~about 70 wt % of the organic solvent, and about 0.1 wt %~about 20 wt % of the silver compound.

7. The method as set forth in claim 1, wherein the composition further comprises:
    a multifunctional acrylate resin; and
    a photoinitiator.

8. The method as set forth in claim 7, wherein the multifunctional acrylate resin has three or more functions and contains acryl.

9. The method as set forth in claim 8, wherein the multifunctional acrylate resin is at least one selected from a group consisting of ethyleneglycol diacrylate, triethyleneglycol diacrylate, 1,4-butanediol diacrylate, 1,6-hexanediol diacrylate, neopentylglycol diacrylate, pentaerythritol diacrylate, pentaerythritol triacrylate, dipentaerythritol diacrylate, dipentaerythritol triacrylate, dipentaerythritol pentaacrylate, dipentaerythritol hexaacrylate, bisphenol A diacrylate, trimethylolpropane triacrylate, novolac epoxy acrylate, ethyleneglycol dimethacrylate, diethyleneglycol dimethacrylate, triethyleneglycol dimethacrylate, propyleneglycol dimethacrylate, 1,4-butanediol dimethacrylate, and 1,6-hexanediol dimethacrylate.

10. The method as set forth in claim 7, wherein the photoinitiator is at least one selected from a group consisting of a triazine compound, a benzophenone compound, an acetophenone compound, a thioxantone compound, a benzoin compound, a carbazole compound, a diketone compound, a sulfonium borate compound, a diazo compound, and a biimidazole compound.

11. The method as set forth in claim 1, wherein the composition further comprises:
    at least one additive selected from a group consisting of a surfactant, a flow improver, a viscosity modifier, a filler, a silane coupling agent, a dye, a pigment, and a UV absorbent.

12. The method as set forth in claim 7, wherein the composition further comprises:
at least one additive selected from a group consisting of a surfactant, a flow improver, a viscosity modifier, a filler, a silane coupling agent, a dye, a pigment, and a UV absorbent.

13. The method as set forth in claim 1, wherein the applying is performed using spin coating, dip coating, roll coating, spray coating, gravure coating, imprinting, or inkjet printing.

14. The method as set forth in claim 1, further comprising: post-baking the exposed film, after selectively exposing the applied film to light.

15. The method as set forth in claim 1, further comprising: post-curing the developed film, after developing the exposed film.

16. The method as set forth in claim 1, wherein the size of silver particles is in the range of about 10 nm ~about 40 nm.

17. The method as set forth in claim 1, wherein the exposing is performed using an exposure amount in the range of about 50 ~about 800 mJ/cm$^2$.

18. A method of preparing a photosensitive polymer complex containing silver nanoparticles, comprising:
applying a composition including a multifunctional epoxy resin, a photoacid generator, an organic solvent, and a silver compound on a surface of a substrate to form a film;

photoreducing the silver compound by selectively exposing the film to light using a photomask having a pattern, and thereby forming silver nanoparticles uniformly dispersed in the photosensitive polymer complex; and developing the exposed film using a developing solution.

* * * * *